United States Patent
Nair et al.

(10) Patent No.: US 10,352,291 B2
(45) Date of Patent: Jul. 16, 2019

(54) POWER TAKE OFF SYSTEM FOR WAVE ENERGY CONVERTOR

(71) Applicant: Oscilla Power, Inc., Seattle, WA (US)

(72) Inventors: Balakrishnan G Nair, Sandy, UT (US); Timothy R Mundon, Seattle, WA (US)

(*) Notice: Subject to any disclaimer, the term of this patent is extended or adjusted under 35 U.S.C. 154(b) by 102 days.

(21) Appl. No.: 15/268,341

(22) Filed: Sep. 16, 2016

(65) Prior Publication Data

US 2017/0002789 A1     Jan. 5, 2017

Related U.S. Application Data

(63) Continuation-in-part of application No. 15/230,214, filed on Aug. 5, 2016, and a continuation-in-part of application No. 14/855,135, filed on Sep. 15, 2015, and a continuation-in-part of application No. 14/808,436, filed on Jul. 24, 2015, now Pat. No. 9,656,728, and a continuation of application No. 14/181,574, filed on Feb. 14, 2014, now Pat. No. 9,438,138, and a continuation-in-part of application No. 12/217,772, filed on Jul. 7, 2008, now Pat. No. 8,235,268.

(60) Provisional application No. 62/219,573, filed on Sep. 16, 2015, provisional application No. 62/050,748, filed on Sep. 15, 2014, provisional application No. 62/028,582, filed on Jul. 24, 2014, provisional application No. 61/809,155, filed on Apr. 5, 2013.

(51) Int. Cl.
*F03B 13/18* (2006.01)
*F03C 1/00* (2006.01)
*H02N 2/00* (2006.01)

(52) U.S. Cl.
CPC .............. *F03B 13/189* (2013.01); *F03C 1/00* (2013.01); *H02N 2/00* (2013.01); *F05B 2260/406* (2013.01); *Y02E 10/38* (2013.01); *Y10S 224/924* (2013.01)

(58) Field of Classification Search
CPC ............ F03B 13/189; F03C 1/00; H02N 2/00
See application file for complete search history.

(56) References Cited

U.S. PATENT DOCUMENTS

| | | | |
|---|---|---|---|
| 3,945,206 A * | 3/1976 | Krause | B21J 7/14 60/374 |
| 4,296,677 A | 10/1981 | Little et al. | |
| 4,883,411 A * | 11/1989 | Windle | F03B 13/1855 290/53 |

(Continued)

FOREIGN PATENT DOCUMENTS

WO     2013140042 A2     9/2013

OTHER PUBLICATIONS

Young "International Search Report" PCT/US16/52304, dated Dec. 27, 2016, 2 pages.

(Continued)

*Primary Examiner* — Viet P Nguyen
(74) *Attorney, Agent, or Firm* — Intellectual Strategies

(57) ABSTRACT

A device for generating electrical energy from mechanical motion includes a surface float and at least one force modifier disposed at least partially within the interior of the surface float, the force modifier to receive an input force at a pumping cylinder and apply a modified force to a generator through a driving cylinder. The pumping cylinder or the driving cylinder is a tandem cylinder.

13 Claims, 6 Drawing Sheets

(56) References Cited

U.S. PATENT DOCUMENTS

| | | | | |
|---|---|---|---|---|
| 6,065,945 | A * | 5/2000 | Zamzow | F03C 1/0073 |
| | | | | 417/401 |
| 6,457,307 | B1 * | 10/2002 | Feldman | F03B 13/148 |
| | | | | 417/330 |
| 2006/0208839 | A1 * | 9/2006 | Taylor | F03B 13/1895 |
| | | | | 335/205 |
| 2008/0012344 | A1 * | 1/2008 | Buffard | F03B 13/187 |
| | | | | 290/53 |
| 2010/0207390 | A1 | 8/2010 | Zimmermann et al. | |
| 2011/0031749 | A1 * | 2/2011 | Sapir | F03B 13/20 |
| | | | | 290/50 |
| 2011/0042954 | A1 * | 2/2011 | Werjefelt | F03B 13/20 |
| | | | | 290/53 |
| 2012/0047884 | A1 * | 3/2012 | McBride | F03G 6/00 |
| | | | | 60/327 |
| 2014/0007568 | A1 * | 1/2014 | Crowley | F03B 11/004 |
| | | | | 60/497 |
| 2014/0138953 | A1 * | 5/2014 | Franklin | F03B 13/20 |
| | | | | 290/53 |
| 2014/0225371 | A1 * | 8/2014 | Nair | H02N 2/18 |
| | | | | 290/53 |
| 2014/0230426 | A1 * | 8/2014 | Tuokkola | F03B 13/16 |
| | | | | 60/497 |
| 2014/0305118 | A1 | 10/2014 | Tai | |
| 2015/0266549 | A1 * | 9/2015 | Qu | F03D 3/02 |
| | | | | 248/550 |
| 2017/0009732 | A1 * | 1/2017 | Mundon | F03B 13/189 |

OTHER PUBLICATIONS

Young "Written Opinion of the International Searching Authority" PCT/US16/52304, dated Dec. 27, 2016, 5 pages.

* cited by examiner

POWER TAKE OFF SYSTEM FOR WAVE ENERGY CONVERTOR

CROSS-REFERENCE TO RELATED APPLICATIONS

This application claims the benefit of U.S. Provisional Application No. 62/219,573, filed on Sep. 16, 2015, which is incorporated by reference herein in its entirety. This application also is a continuation-in-part of U.S. application Ser. No. 15/217,772, filed on Jul. 22, 2016, which claims the benefit of U.S. Provisional Application No. 62/195,693, filed on Jul. 22, 2015. This application also is a continuation-in-part of U.S. application Ser. No. 15/230,214, filed on Aug. 5, 2016 which is a continuation of U.S. application Ser. No. 14/181,574, filed on Feb. 14, 2014, which claims the benefit of priority of U.S. Provisional Application No. 61/809,155, filed on Apr. 5, 2013. This application also is a continuation-in-part of U.S. application Ser. No. 14/808,436, filed on Jul. 24, 2015, which claims the benefit of priority of U.S. Provisional Application No. 62/028,582, filed on Jul. 24, 2014. This application also is a continuation-in-part of U.S. application Ser. No. 14/855,135, filed on Sep. 15, 2015 which claims the benefit of priority of U.S. Provisional Application No. 62/050,748, filed on Sep. 15, 2014. Each of these references is incorporated by reference herein in their entirety.

BACKGROUND

Repeating wave motions contain large amounts of energy that can be converted and harnessed in wave environments across the world.

SUMMARY

Embodiments of a device for generating electrical energy from mechanical motion are described. In one embodiment, the device for generating electrical energy from mechanical motion includes a surface float and at least one force modifier disposed at least partially within the interior of the surface float, the force modifier to receive an input force at a pumping cylinder and apply a modified force to a generator through a driving cylinder. The pumping cylinder or the driving cylinder is a tandem cylinder. Other embodiments of the device for generating electrical energy from mechanical motion are also described.

In some embodiments, the generator is a linear actuated generator. In some embodiments, the generator is a variable reluctance magnetostrictive generator. In some embodiments, the modified force applied to the generator is greater in magnitude than the input force. In some embodiments, the modified force applied to the generator is smaller in magnitude than the input force. In some embodiments, the generator is a high-displacement, multi-pole generator. In some embodiments, the pumping cylinder includes a pumping tandem cylinder and the driving cylinder includes a driving tandem cylinder.

Embodiments of a method for generating electrical energy from mechanical motion are described. In one embodiment, the method includes receiving an input force from a mechanical motion, modifying the input force to an output force, and applying the output force to a generator disposed within an interior of a surface float. Modifying the input force includes receiving the input force at a pumping cylinder and converting the input force to an output force at a driving cylinder. The pumping cylinder includes a pumping tandem cylinder or the driving cylinder includes a driving tandem cylinder. Other embodiments of a method for generating electrical energy from mechanical motion are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1A:
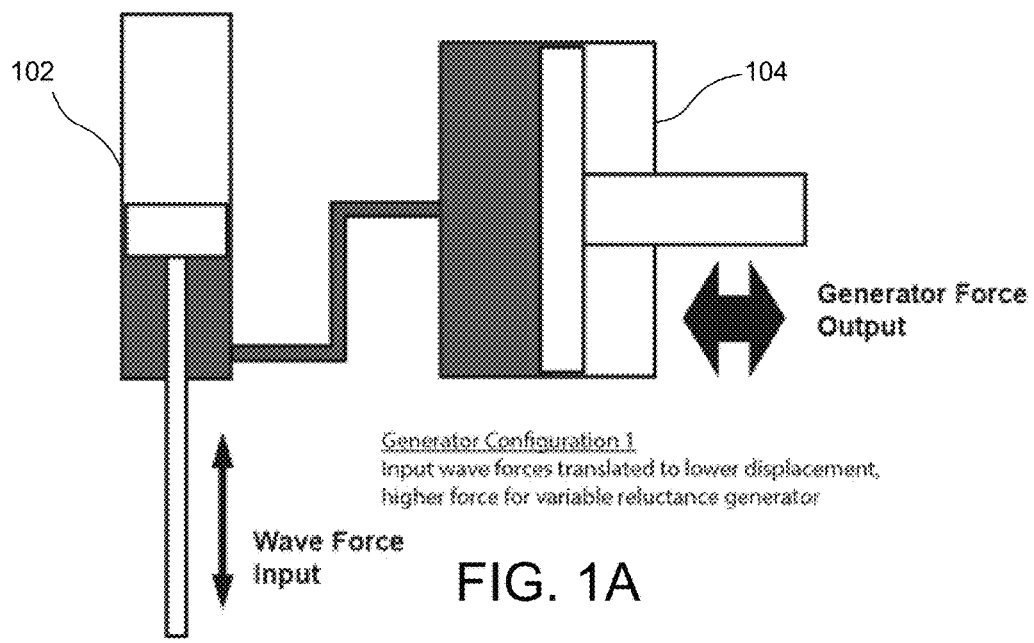
FIG. 1A depicts an embodiment of a configuration of a linear generator where input wave forces are translated to lower displacement and higher forces.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Some embodiments describe a high reliability, variable-damping linear drivetrain concept, which combines a linear hydraulic "gear-box" and a linear generator solution to provide high reliability and active variability. This design enables high energy capture by tuning across a wide range of conditions, require minimal scheduled maintenance and can operate successfully over the system lifetime.

Some embodiments combine a nearly hydrostatic linear hydraulic gearbox 210 with a linear generator 212, which may be a multi-pole linear generator 212 or an innovative, highly reliable variable reluctance generator 212. The linear gearbox 210, which operates similarly to a hydraulic press, translates highly variable wave generated linear mechanical energy into loads and displacements of an optimal magnitude to maximize performance of both these classes of linear generators 212.

In some embodiments, the linear hydraulic gearbox 210 may be used with high-force, low-displacement, variable reluctance magnetostrictive power generator 212, where the optimal input to the generators 212 is a high force, low displacement input (FIG. 1A). Variable reluctance is achieved through the use of magnetostrictive alloys and/or a variable air gap in the generator 212. As described in detail later, this version of linear drive-train can enable high-efficiency, wide-band energy capture from ocean waves with a relatively simple (i.e., highly reliable and low cost) prime mover such as Oscilla Power Inc.'s ("OPI") Triton™ wave energy converter ("WEC"), a point absorber that captures energy from both heave and pitch (see e.g., FIGS. 2A and 2B).

Figure 1B:
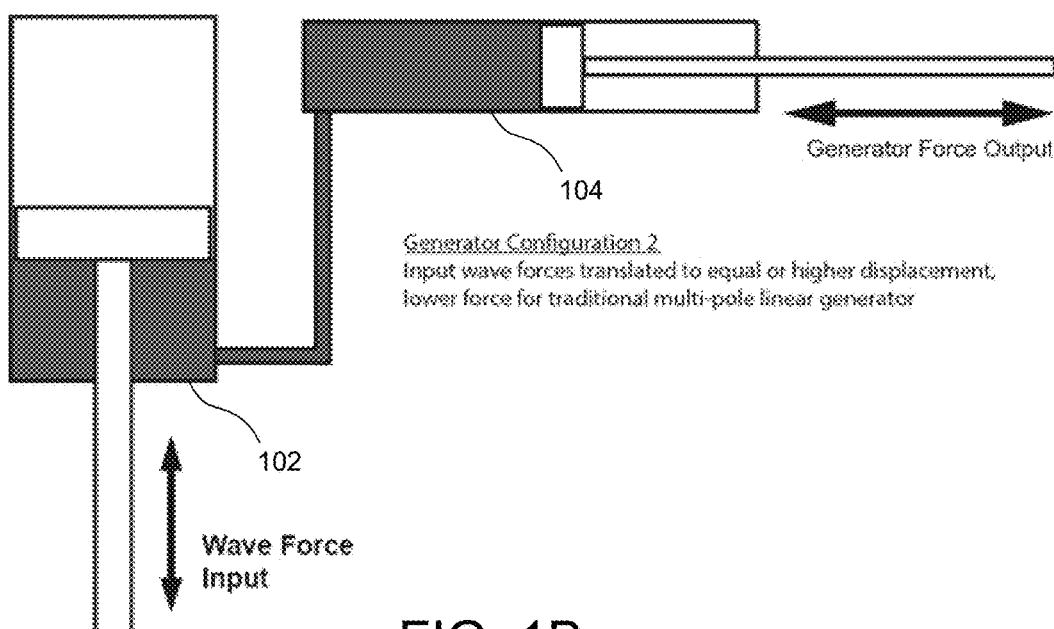
FIG. 1B depicts an embodiment of a configuration of a linear generator where input wave forces are translated to higher displacement and lower forces.

Alternatively, in some embodiments, the linear hydraulic gearbox 210 can be used with linear generators 212. In this case, the function of the linear hydraulic gearbox 210 is analogous to a rotary gearbox (increasing linear velocity rather than RPM) ensuring that the input force is tuned so that the linear generator 212 can be substantially smaller for the same capacity, and operates at high efficiency (FIG. 1b).

Power conversion technologies are combined with the linear drivetrain to form a low cost, highly efficient and highly reliable power take-off (PTO). It is anticipated that the optimal approach identified through this approach will enable a cost structure with low WEC capital expenditures (CAPEX) in large arrays. The linear drivetrain can enable a power take-off (PTO) solution that can be configured for use with a wide range of wave energy converters, ranging from point absorbers and attenuators to Oscilla Power's Triton device, a multi-mode point absorber. The linear drivetrain promises to enable high conversion efficiency across the wave spectrum without sacrificing cost or reliability, with only minimal scheduled maintenance over the system's 20+ year lifetime.

Specific accomplishments that have validated the value proposition of embodiments of this invention include: (1) the linear gearbox's 210 high reliability and efficiency in extensive laboratory testing and ocean trials; (2) the robustness and durability of OPI's magnetostrictive generators 212, which have been subjected to millions of load cycles without any measureable performance degradation or signs of failure; and (3) the achievement of high energy efficiencies for potential sub-components such as the linear hydraulic gearbox 210 and the linear generators 212 and (4) OPI's projections of levelized cost of electricity (LCOE) using detailed cost/performance models that have been reviewed and validated by independent third parties. With regards to the generator 212 subsystem, a variety of variable reluctance (including magnetostrictive) and linear generators 212 have been extensively modelled using tools such as first principles models built on both MATLAB and Wolfram Mathematica platform while more comprehensive electromagnetic finite element analysis (FEA) is performed using COMSOL. Validation of these generator models, through extensive experimental laboratory testing and at a range of scales from 1:16 to 1:2 has been conducted, with OPI's current focus being on optimizing performance at the 1:2 scale.

The linear drivetrain described herein comprises a linear hydraulic gearbox 210 coupled with one of a number of different linearly actuated generator 212 concepts ranging from a very stiff variable reluctance generator 212 (e.g., OPI's magnetostrictive generator 212) to a high-displacement, multi-pole generator 212.

In essence, the linear gearbox 210 allows the wave-generated forces from the marine system to be manipulated and adjusted for application to a linear generator 212 so that the generator 212 can operate at maximum efficiency. This operation can be seen to be somewhat analogous to a rotary gearbox 210, which converts input rotary energy at one RPM into a different (usually higher) RPM that is more suitable for optimal performance of a rotary generator 212. In OPI's linear generator 212, this is achieved through a simple, nearly hydrostatic system similar to that used in a hydraulic press, whereby a compressive force on one cylinder is transferred directly to another cylinder with a different piston area, thereby applying an amplification ratio that is dependent upon the ratio of the piston areas. Normally such a system would have an amplification ratio that is set during the design, but by using tandem cylinders (i.e., cylinders with multiple chambers 112, 122 and pistons on a single rod) and appropriate valving, this ratio can be adjusted during operation. Further, by introducing other valves 402, 404, 406 and flow paths into the system, a number of innovative control schemes can be applied that would not be feasible if a direct drive or mechanical linkage were employed—these are described in more detail herein.

The coupling of the linear gearbox 210 with a linear generator 212 offers many drivetrain options that embody trade-offs between technical risk and maintenance cost. At the one end of this scale is a multi-pole linear generator 212. In this combination, the linear gearbox 210 provides an effective spring and damping coefficient that is optimized for the wave environment, and this captured mechanical energy can be transferred to linear generators 212 with an appropriately amplified displacement/velocity. This approach could reduce required generator 212 mass and cost substantially, to the point where the generator 212 only employs components suitable for high-volume manufacturing. Further, this decouples generator 212 sizing from the available float displacement, providing flexibility that can be used to minimize cost and maximize reliability. An additional advantage is that the return spring forces, which can be challenging to design for in a multi-pole linear generator 212 configuration, can be integrated into the linear gearbox 210. Such a spring would be an integral part of the gearbox 210 subsystem and can be implemented simply by using an accumulator with an external air tank to minimize energy losses. These forces would help to reduce end stop requirements, further lowering cost and increasing reliability.

Advanced linear generators 212, and particularly variable reluctance generators 212, offer the possibility for significantly more reliable system performance. Integration of a variable reluctance generator 212 with a linear gearbox 210 enables this advantage to be maximized. There are two approaches to variable reluctance. In the first, variable reluctance is driven by changing the stress on magnetostrictive components of the magnetic flux path. The magnetic permeability of these components, and thus the reluctance of the magnetic flux path, is a function of stress. In the second, the variable reluctance can be due to elastic extension of components that control a variable air gap within a magnetic circuit. In both of these designs, the key advantages are high reliability (due to the low displacements involved in the linear gearbox 210), and the fact that no end-stops or high-displacement return springs are needed. In effect, the return spring is built into the system from the elastic deflection of the generator 212 itself.

Figure 3:
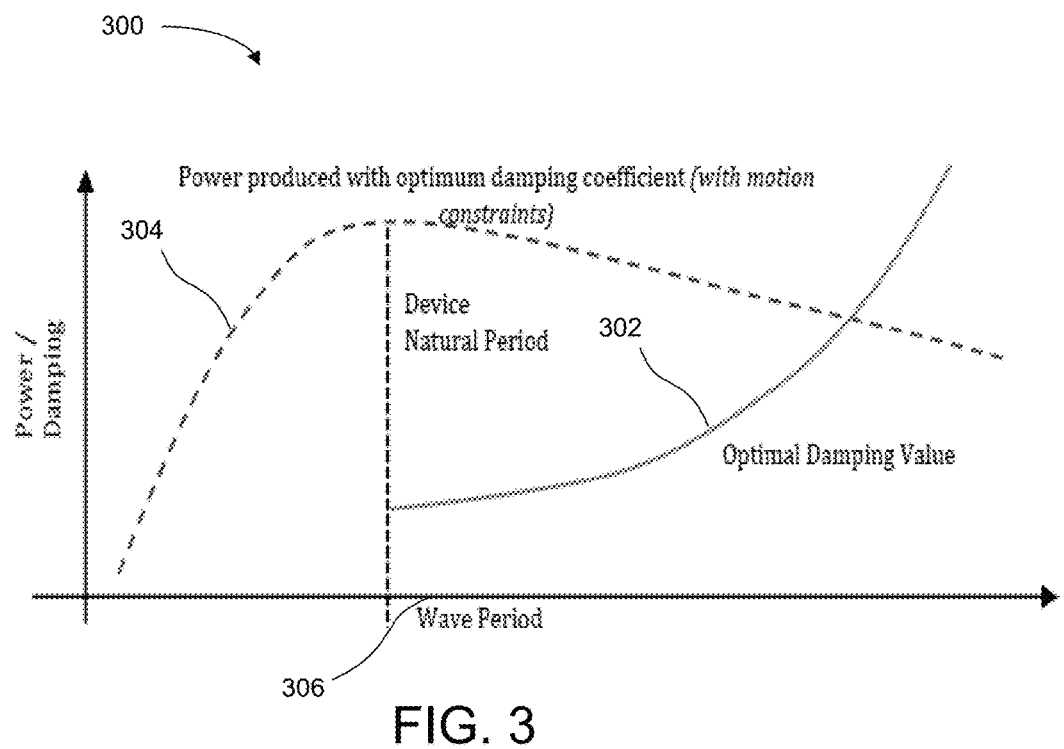
FIG. 3 depicts one embodiment of a graphical depiction of power and damping plotted against wave period.

In a typical point absorber, the damping coefficient 302 required for maximum power generation 304 increases as the incident wave period 306 becomes longer than the WEC's natural period. This is illustrated in FIG. 3. Conventional generators struggle to operate efficiently or reliably at the higher damping values required for longer wave periods, and therefore the overall efficiency drops significantly in this region. OPI's magnetostrictive generator 212 has an intrinsically high damping coefficient, enabling it to operate more efficiently and reliably in this region. When the wave period is close to the WEC's natural period, a conventional generator 212 may have a higher efficiency than a magnetostrictive generator 212, but it will also have higher displacements, which will need to be carefully accommodated to ensure high reliability.

This advantage is especially important as it enables better matching of the device to the input wave so as to allow a smaller (lower cost) float to provide the same energy capture as that provided by a larger unit (i.e., heavy, expensive). The intrinsically high damping of OPI's magnetostrictive generator 212 improves efficiency in this non-resonant regime; in conjunction with a lower cost structure these gains more than compensate for reduced performance (relative to conventional generators) in resonant conditions. These "no moving parts" power generators 212 have closed magnetic paths made of steel and load-bearing, magnetostrictive iron-aluminum (Fe—Al) rods. The driving magnetomotive force in each generator 212 is provided by small permanent magnets that make up a very small fraction of the generator's 212 mass. In OPI's Triton WEC, the mechanical energy captured from the waves by the system is transmitted to the generators 212 through the tethers 202 as a high force, low displacement mechanical energy input. The stress changes imposed on the generators 212 create substantial changes in the magnetic permeability of the Fe—Al rods, resulting in changes in the flux density in the magnetic circuit. Electricity is generated by electromagnetic induction, using copper or aluminum coils wound around the alloy rods, with essentially no relative motion. The current in the coil produces a force that is opposite to the change in magnetic flux, and therefore opposite to the applied force, resulting in electromechanical coupling.

Model System Considerations:

In some embodiments, the linear drivetrain will be optimized initially for use with the Triton WEC. While the baseline diameter for the Triton WEC's surface float 206 is 27 m, OPI aims to reduce it through the application and optimization of the PTO system described here to reduce extreme loads and minimize system mass.

In some embodiments, each tether 202 is connected mechanically to a linear gearbox 210 through a load transfer unit 208 ("LTU") that eliminates off-axis loads (e.g., a tether coupling point). In some embodiments, the LTU 208 is a vertically oriented cylinder comprised of a sea-water lubricated bearing material around steel, attached to the tether 202 at the bottom and to the linear gearbox 210 at the top. The cylinder moves within a steel tube that was a structural part of the surface float 206. Some embodiments include a similar design, scaled up to accommodate the higher loads.

Linear Gearbox 210 Architecture:

In some embodiments of a WEC, the input wave forces will be realized as tension changes in the tethers 202 that are applied directly to 'pumping' cylinders 102. Linear gearboxes 210 connect each of the cylinders to four variable reluctance generators 212. Thus, in some embodiments a system would have three 'pumping' cylinders, three linear gearboxes 210 and twelve discrete generators 212. Other configurations are envisioned within the scope of this disclosure.

In some embodiments, each generator 212 is actuated by a 'driving' hydraulic cylinder whose sizing depends on the nature of the generator 212. The Triton WEC's variable reluctance generators 212 require a very high force, low displacement energy, so the linear gearbox 210 applies a positive ratio of force (i.e., a small diameter pumping cylinder 102 is connected to the input force while a large diameter driving cylinder 104 acts upon the generator 212) such that a low magnitude, high displacement input is translated into high magnitude, low displacement output. Conversely, when used with some linear generators 212, a large diameter pumping cylinder 102 is connected to the input force while a small diameter cylinder acts upon the generators 212 so that displacement is amplified.

Figure 4:
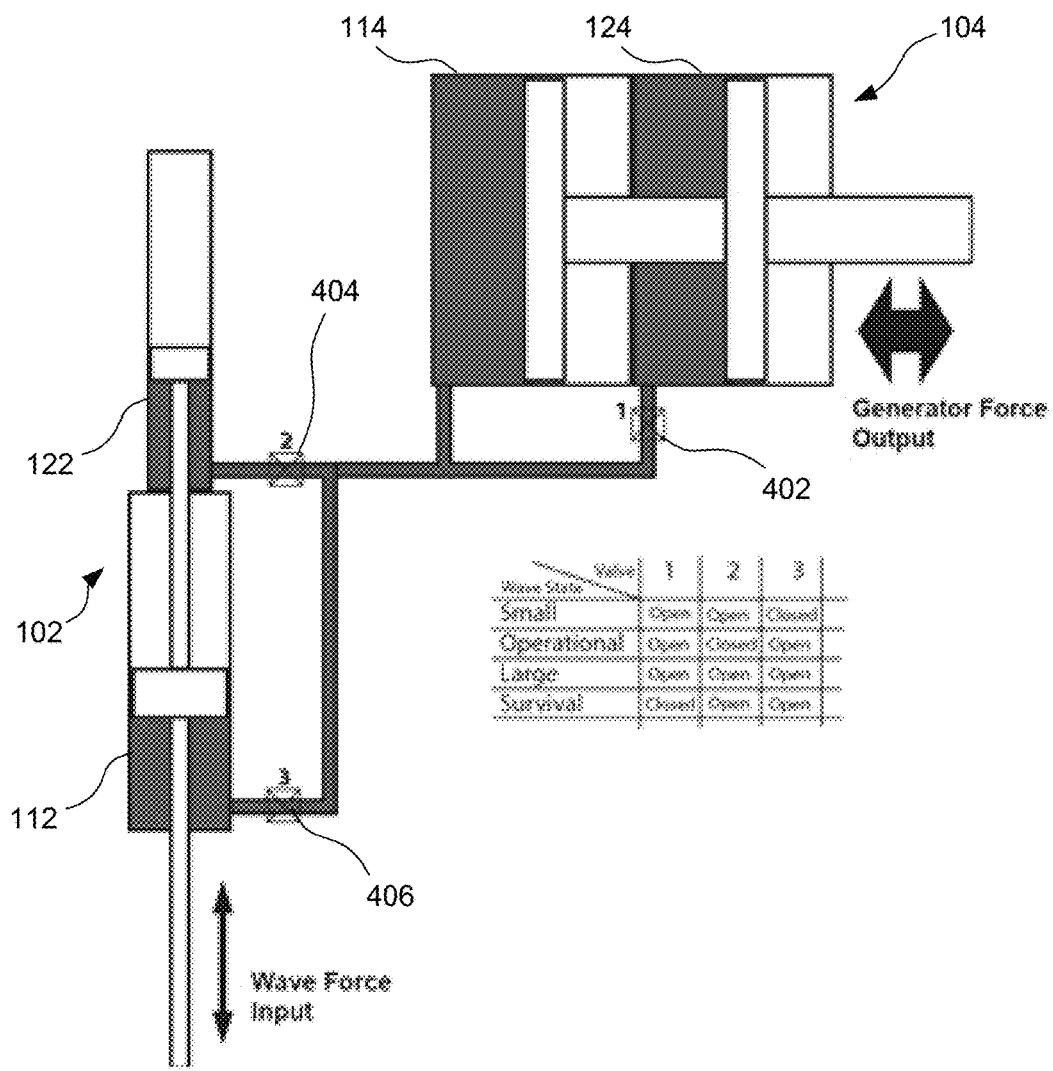
FIG. 4 depicts an embodiment of a configuration of a linear generator with tandem cylinders.

In some embodiments, the pumping cylinder 102 is a triple tandem cylinder, while each generator 212 is driven by tandem driving cylinders 104. The gearboxes 210 operating states can be described as follows (see FIG. 4):

1. Under operational waves, a single chamber (e.g., first pumping chamber 112) in the pumping cylinder is connected to the both of the chambers (e.g., first driving chamber 114 and second driving chamber 124) in the driving cylinder 104, providing a particular amplification ratio.

2. In small waves, the pumping cylinder 102 switches to the smaller diameter chamber (e.g., second pumping chamber 122), providing a higher amplification ratio, lower system compliance, and increased displacement, which increases the loads to the generator 212 (until maximum displacements are reached).

3. In large waves, two of the pumping cylinder chambers (e.g., first pumping chamber 112 and second pumping chamber 122) are activated, lowering the amplification ratio, pumping cylinder travel and the loads applied to the generator 212. The system, however, will continue to generate rated power. This configuration effectively de-tunes the system response, reducing the amount of excess electrical power produced under highly energetic conditions, and allowing for lower ratings in power electronics and more manageable heat dissipation capacity that needs to be engineered for the PTO.

4. In a survival (extreme waves) or fault state, it may be necessary to reduce the loads being applied to the generator 212 to avoid overload. In this case, two pumping cylinder chambers (e.g., first pumping chamber 112 and second pumping chamber 122) are connected to only one of the driving cylinder chambers (e.g., one of first driving chamber 114 or second driving chamber 124), further lowering the amplification ratio and limiting the maximum force that can be applied to the each generator 212.

5. The survival configuration (4) will be further enhanced by adding energy dissipation into the hydraulic system. This would be completed by diverting flow from the primary hydraulic loop through a series of orifices (pressure reducing valves) designed to dissipate the energy in the fluid by creating pressure drops and consequently heating the fluid, which can then be dissipated through a seawater-cooled heat exchanger.

6. Additional states and combinations exist for other eventualities, such as service, installation or system shutdown.

One challenge is that by switching to a higher load multiplier, the travel of the pumping cylinder 102 also increases and there is the risk that this could result in excessive cylinder travel and requirement for end-stops. Some embodiments choose an amplification factor and operating point that maximizes the travel of the float, while not requiring significantly more travel than can be reasonably accommodated.

Some embodiments are intrinsically more reliable than conventional hydraulics used in WECs as the use of a nearly hydrostatic system results in low travel, low flow, low heat and low frequency—key factors that enable high-reliability hydraulic systems.

Possible combinations of a linear gearbox 210 and a linear generator 212 include: Magnetostrictive generator 212, Variable air gap generator 212, Magnetostrictive +variable air gap generator 212, a multi-pole generator 212, or combinations thereof.

For options 1-3, trade-offs can be done between unidirectional and switching flux designs. In the former, flux varies between high and low values in one direction; this is a simpler design that is easier to design and model. Switching designs introduce a secondary flux path and asymmetrical loading on the primary flux paths. This effects component reluctances such that the direction of flux in the secondary flux path switches during a loading cycle. Switching designs can potentially allow for significantly increased flux change, facilitating the use of smaller coils, but they are more complex to design and model. For option 4, the trade-offs can be done between moving magnet or moving coil designs and a variety of magnet and coil geometries.

Figure 5:
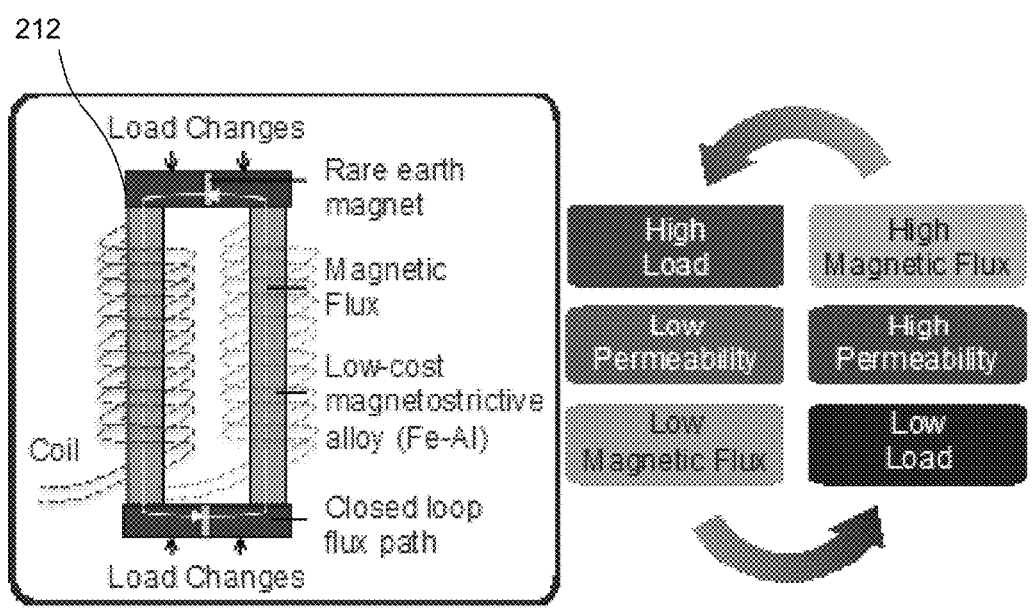
FIG. 5 depicts one embodiment of a magnetostrictive generator with a closed loop flux path.

Magnetostrictive Variable Reluctance Generators:

Magnetostrictive generators 212 are a class of variable reluctance generators 212 that have unique reliability, integration and cost advantages due to the fact that the spring elements are built into the generator 212 itself and that very little displacement is needed (FIG. 5). Based on the principle of reverse magnetostriction, in which certain ferromagnetic alloys experience significant magnetic permeability changes when subjected to changes in stress, the Triton WEC's magnetostrictive generators 212 require no relative motion. Power is produced via electromagnetic induction from magnetic flux changes caused by very small, compression-induced deformations of the magnetostrictive alloys. The generators 212 require high forces, but very low displacements (and velocities), and thus can provide very high damping coefficients. These generators 212 have closed magnetic paths composed largely of steel and magnetostrictive iron-aluminum (Fe—Al) cores. The driving magnetomotive force is provided by permanent magnets that are a very small fraction of the generator 212 mass. When the Triton WEC interacts with ocean waves, the motions of the surface float 206 relative to the heave plate 204 generate significant changes in tether 202 tension, which are transmitted to the generators 212 as high force, low displacement mechanical energy via the linear hydraulic gearbox 210. These stress changes result in substantial changes in the magnetic permeability of the Fe—Al cores, resulting in changes in the flux density in the magnetic circuit. Electricity is generated by electromagnetic induction, using copper or aluminum coils wound around the alloy rods, with no relative motion of the coil and core. The current in the coil produces a force that is opposite to the change in magnetic flux and the applied force, resulting in electromechanical coupling.

The operating principle of the linear gearbox 210, the wave-facing end of the drivetrain, is analogous to a rotary gearbox in that it allows optimum matching of the input driving forces to the generator 212 input forces so as to keep the generator 212 operating at maximum efficiency. The gearbox's design allows for the load or velocity amplification level to change automatically during operation based on the wave state, enabling generator 212 displacements to be maintained at an optimum level that is largely independent of the WEC's displacement. Additionally, such a system provides for the introduction of various non-continuous control strategies such as latching and declutching without imposing excess loadings on the generator 212 or marine system. Another unique aspect of the linear drivetrain is its ability to use variable reluctance generators 212, such as OPI's magnetostrictive generator 212. This generator 212 provides greatly increased reliability over moving magnet designs due to the minimal displacement and zero core motion relative to coil motion. By using a variable reluctance generator 212 in conjunction with the linear gearbox 210, the linear drivetrain may enable wider power bandwidth and increased reliability at an attractive cost structure for a very wide range of WECs, While the use of the linear drivetrain enables the incorporation of variable reluctance generators 212, it is equally feasible to combine the linear hydraulic gearbox 210 with multi-pole linear generators 212. These two options present different value propositions, with the variable reluctance systems offering very high reliability and wide-band energy capture, and the linear generator 212 based system offering high top line energy conversion efficiencies and reduced generator 212 mass. The choice of the optimal architecture, driven by LCOE, will be unique to a specific wave environment.

Deep consideration of the manufacturability and operability of the linear drivetrain and the Triton WEC has been embedded in OPI's development process from its earliest days. Limited reliance on permanent magnets and design simplicity (to enable a wide supply base) are two of the key elements of the value proposition of the OPI's variable reluctance generators 212. Similarly, we have considered the manufacturability, operability, and reliability limits of conventional and custom hydraulics under consideration for the linear hydraulic gearbox 210. Finally, we note that the cost of the linear drivetrain (using a bottoms-up bill of materials) has been included in the Triton WEC's cost model.

Figure 2A:
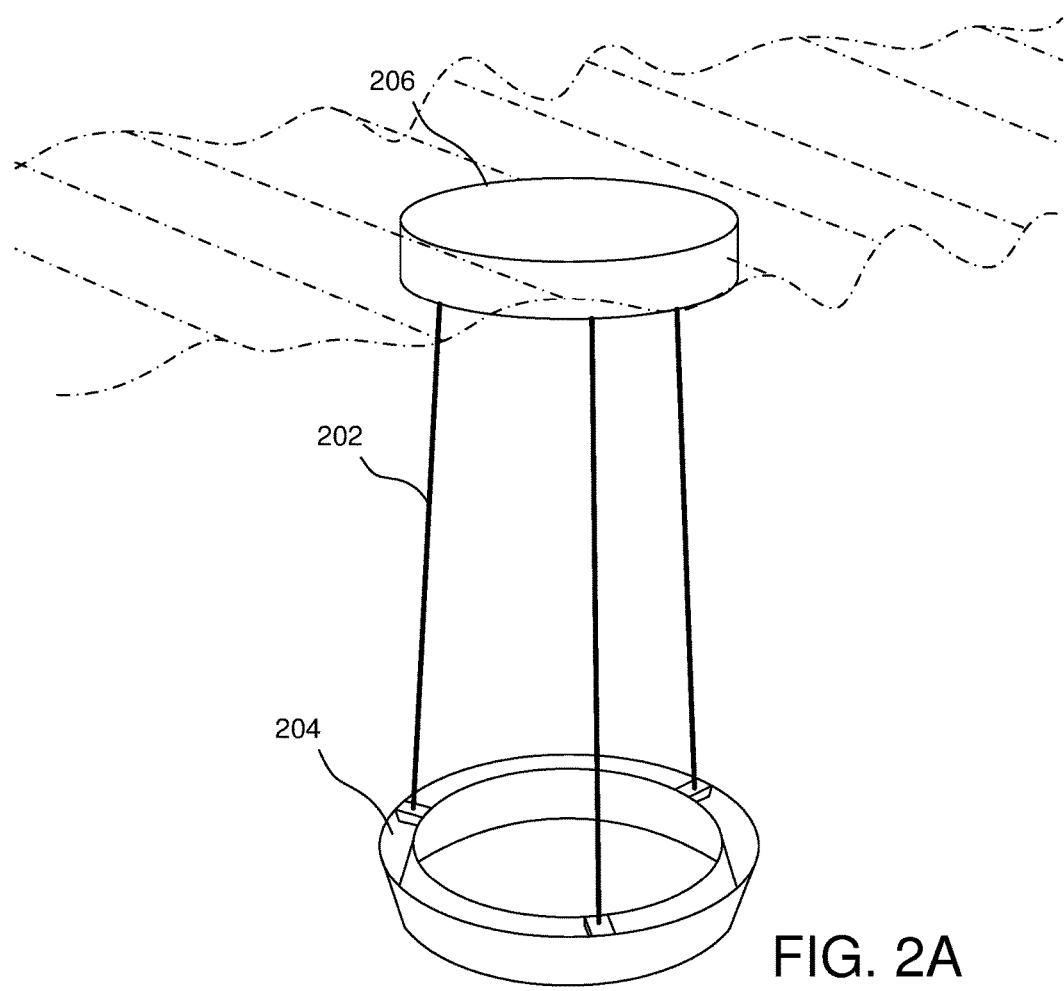
FIG. 2A depicts one embodiment of a wave energy converter including a surface float, a heave plate, and a plurality of tethers.
Figure 2B:
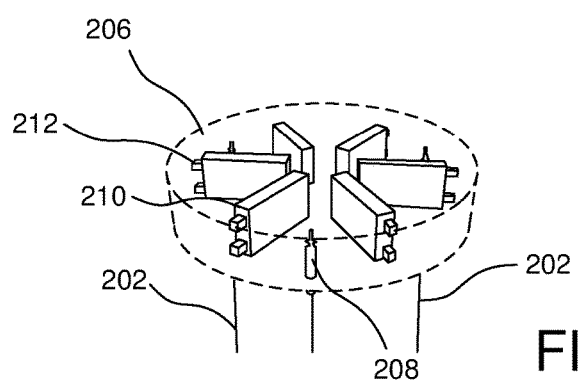
FIG. 2B depicts one embodiment of a surface float, with the surface float partially transparent to show internal components.

One example of a WEC that the drivetrain described in some embodiments may be used with is shown in FIGS. 2A and 2B, in which the Triton comprises of a catenary moored surface float 206 connected to a sub-surface heave plate 204 by taut tethers 202, with the linear drivetrain located inside the surface float 206. This design, which captures energy from the heave, pitch and roll motion of the surface float 206, has significant reliability, performance, operability, survivability and installation advantages compared with other WECs, while maintaining a very attractive cost structure, high reliability and high manufacturability. However, it should be noted that the drivetrain described in this invention can be used with a variety of WECs and the use of the drivetrain with a particular WEC, in no way limits the scope of embodiments.

The Triton WEC can include, but is not limited to, 12 individual generators 212, arranged in six sets of two, with the output of each set being 170 kW under rated operational sea conditions. The aim therefore is that the device will be capable of delivering 1 MW under rated conditions.

Other than the magnetostrictive generators 212, which are in the process of being scaled up to the required size, OPI's proposed solution relies on novel combinations of proven technologies. In some embodiments, novelty lies in the following aspects of the proposed design:

1. The use of a linear gearbox 210 in which a closed loop, nearly-hydrostatic system controls linear motions, 2. The combination of a linear gearbox 210 and a linear generator 212 that facilitates (1) optimal motion of a wave-facing structure across a variety of wave conditions to maximize the energy capture and (2) optimal mechanical to electrical energy conversion efficiency, 3. The use of a hydraulic system to both offset the mean load of a heave plate 204 and potentially avoid applying this load to the generator 212.

4. The use of variable reluctance (magnetostrictive or variable air gap) generators 212 with low displacement, integral spring and high damping.

Cost and reliability remain as critical obstacles to the commercialization of wave energy converter (WEC) technologies. Costs of "mature" devices are currently estimated to be 3-10 times their required level and private investors have not shown a strong interest in financing deployments to drive the learning curves required to allow today's technologies to achieve our collective objectives. Some embodiments have the potential to deliver a very low levelized cost of electricity. This low cost structure is largely enabled by the following features of the linear drivetrain, which are extensible to a wide range of WECs:

1. Potential for reduced generator displacement: A linear drivetrain with variable reluctance generators 212 (e.g., OPI's magnetostrictive generators 212) enables the elimination of moving magnet assemblies and associated sub-system (e.g., lubrication, bearings) costs. Usage of the linear drivetrain will significantly reduce operations and maintenance costs of a WEC due to the reduction of the need to periodically service joints, bearings, and other such components.

2. Low cost or readily available materials: In some embodiments, the materials sets for OPI's linear drivetrain do not include significant quantities of any supply limited or expensive materials. In some embodiments, materials include aluminum, iron, copper, and steel. Some embodiments include only small amounts of permanent magnet—less than 0.1% of the total generator 212 weight—are used in variable reluctance generators 212. Concrete and glass-reinforced plastic may also be used may be used in the heave plate 204 and surface float 206, respectively.

3. Low cost manufacturing: In some embodiments, all of the components of the linear generators 212 considered for inclusion in the linear drivetrain are amenable to low-cost, high-volume manufacturing. Significant cost reductions can be achieved with the volume purchasing embedded in a single WEC (let alone an array of WECs). The power conversion systems required to convert the output of the linear drivetrain into grid-quality electricity and/or integrate such output with any desired array-level energy storage medium have straightforward topologies.

4. Improves performance across the wave spectrum: By optimally coupling the input forces with those required by an electromagnetic generator 212, the linear gearbox 210 enables much improved power performance across the full range of wave heights, significantly increasing efficiency in small waves by altering the load and displacement transfer ratio. In addition, the linear gearbox 210 enables the introduction of high-reliability active control strategies, which holds the potential to further improve power capture in periods away from device resonance.

5. Limited reliance on end stops: End stops are a requirement for any linearly actuated wave energy device to prevent excess displacements and system damage in the case of large waves. In some embodiments, the combination of a linear gearbox 210 and a variable reluctance generator 212 (or a linear generator 212 with additional return spring functionality added to the gearbox 210) provides an increasing force-displacement curve that provides a natural limit to displacement as the input force increases. Additionally, in order to manage extreme events, the gearbox 210 can be adjusted to limit the force-displacement curves of both the primary input and the generator 212 output.

6. Ability for implementation of active control: In some embodiments, the linear gearbox 210 system allows the ability to implement active device control on a wave-by-wave basis. Active control strategies, such as latching or declutching can be implemented through manipulation of valves 402, 404, 406 within the system and there maybe the possibility of applying more advanced control strategies such as reactive or complex conjugate control, although at the cost of increasing system complexity. The introduction of active control provides the ability to increase device power output in smaller waves and provide a significant benefit in terms of AEP.

Embodiments described herein may have uses with various other types of wave energy converters, including, but not limited to the ones described below.

Attenuator:

In an attenuator type device, the primary hydraulic driving cylinders 104 can provide the primary linear input to the linear gearbox 210 and enable the use of a variable reluctance or linear generator 212, rather than being limited to a rotary hydraulic generator 212. Use of such a linear drivetrain that enables a high degree of adjustment of effective damping and stiffness, can increase the energy capture across the wave spectrum.

Point Absorber:

Some embodiments are directly applicable to any devices in this category that currently use a linear generator 212, and may offer a significant improvement to other devices that use flexible tethers 202 to drive a rotary drivetrain.

Oscillating Surge Wave Converter (OSWC):

In some embodiments such as an OWSC type device, a hydraulic cylinder connected to the surge flap would provide the primary linear input to the linear gearbox 210 and enable the use of a variable reluctance or linear generator 212, rather than being limited to onshore or offshore rotary hydraulic generators 212. Use of such a linear drivetrain that enables a high degree of adjustment of effective damping and stiffness, can increase the energy capture across the wave spectrum.

Application outside Wave Energy:

Embodiments of the invention described herein may be used outside of wave energy, including, but not limited to downhole oil and gas applications. In one such application, the forces and vibrations present just above the drill bit are converted into small amounts of reliable power during drilling operations. This power will be used to enhance the operating and/or telemetry capabilities of measurement-while-drilling (MWD) and logging-while-drilling (LWD) sensors used to assess the position and direction of the drill bit as well as the characteristics of the surrounding environment. This will allow more efficient and effective drilling operations, while reducing the operational cost of drilling operations by extending the intervals between battery replacement (which reduces the very significant cost of downtime), and potentially eliminating battery usage altogether. The generator 212 for this application, which meets the key form factor and robustness specifications for the application, has already demonstrated achievement of the target power levels. Separately, concepts have also been developed for devices that can continuously produce small amounts of power from hydrocarbon flow in completed wells to power downhole sensors and valves that can enable more efficient production.

Key factors for a successful wave energy device include performance, affordability, availability and survivability, and embodiments described herein boost all of these factors as detailed herein.

Performance:

In some embodiments, OPI's linear drivetrain has strong potential to achieve high power capture and high conversion efficiency. The former is achieved through the linear gearbox's 210 ability to adjust the effective generator 212 parameters to match the sea-state and, when used with variable reluctance generators 212, by having the capability to operate at higher damping levels than conventional systems. The latter can be achieved through the use of linear generators 212 operating under optimum motions (as enabled by the linear gearbox 210). Such ultra-high efficiency designs may trade off reliability with efficiency.

Affordability:

In some embodiments, the following features indicate that OPI's linear drivetrain has the potential to enable a significantly improved cost structure for a number of wave energy converters: (1) high power capture for a given size of device, as described in 6.2.1 and high availability as described in 6.2.3, (2) low CAPEX, enabled by simple hydraulic systems that are easily manufactured, and by generator 212 designs amenable to high volume manufacturing.

Availability:

OPI's linear drivetrain can offer a step change in reliability to the wave energy industry. The linear gearbox 210 based is a fundamentally more reliable approach relative to hydraulic systems that employ rotary generators 212 due to the relative simplicity and durability of the parts involved. Some embodiments of the variable reluctance generator 212 described herein provide significant increases in reliability due to an architecture that eliminates the vast majority of moving parts compared to conventional generators.

Survivability:

In some embodiments, OPI's linear drivetrain enables a survivable WEC design by being able to minimize prime-mover displacements and manage peak loads. Additionally, some embodiments have the ability to dissipate additional power (and hence generator 212 loads) in extreme conditions by using pressure reducing valves and transferring the energy into heat, which can be dissipated by seawater cooled heat exchangers.

Like all hydraulic systems, there is risk of pressure loss in the hydraulic gearbox 210. However, the closed loop nature of the hydraulic system that will go through the highest number of cycles substantially mitigates this risk. While a failure is unlikely, there is potential risk that underestimating the extreme waves that may be experienced may result in a design that cannot cope with extreme loads/displacements. This risk is partially mitigated by the ability of our system to minimize displacements through hydraulic system tuning, and additionally due to the potential for usage of variable reluctance PTOs that are particularly suitable for coping with extreme loads.

Figure 6:
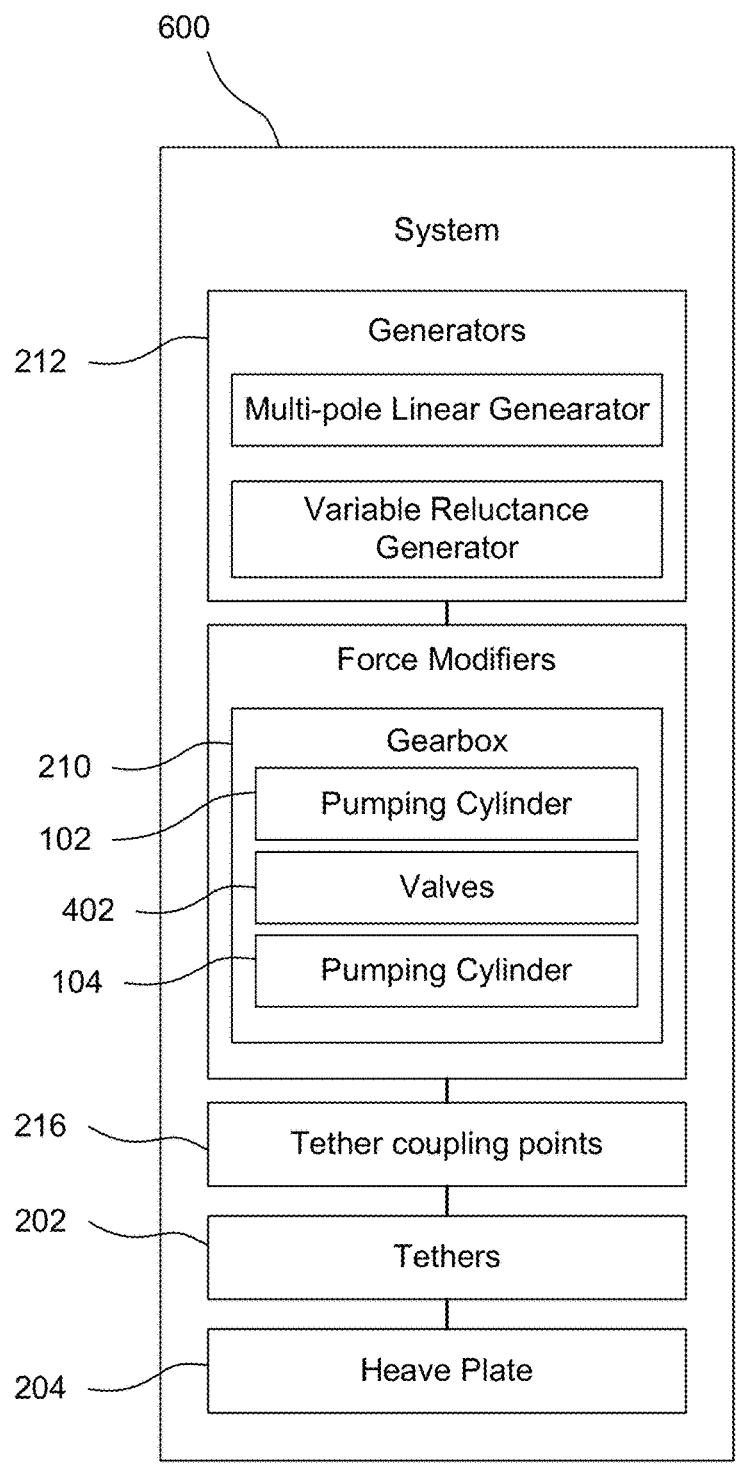
FIG. 6 depicts a schematic diagram of an embodiment of a wave energy converter system.

FIG. 6 depicts a schematic diagram of an embodiment of a wave energy converter system 600. The system includes a heave plate 204 connected to a force modifier through a tether 202 or plurality of tethers 202. The tethers 202 connect to the force modifier at a tether coupling point 216. The force modifier may include a gearbox 210 that modifies the input force from the tethers 202 to convert the input force into an output force on generator(s) 212. The generator(s) 212 and the force modifier(s) may be wholly or at least partially disposed within an interior of a surface float 206. The gearbox 210 may include a pumping cylinder 102, a driving cylinder 104, and a plurality of valves 402, 404, 406. The pumping cylinder 102, which may incorporate a tandem cylinder, receives the input force from the tether 202 causing the fluid in the pumping cylinder 102 to actuate the driving cylinder 104, which may incorporate a tandem cylinder. A plurality of valves may be disposed throughout the gearbox 210, before or after each of the chambers of the pumping cylinder 102 and/or driving cylinder 104. The valves 402, 404, 406 may be situated in various configurations (not specifically described herein) to affect the modification of the input force into an appropriate output force.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

Other embodiments may incorporate one or more other aspects from related descriptions, including the subject matter described and shown in:

U.S. Pat. No. 9,169,823, issued on Oct. 27, 2015, which claims the benefit of priority of U.S. Provisional Application No. 61/664,444, filed on Jun. 26, 2012

U.S. Pat. No. 9,438,138, issued on Sep. 6, 2016, which claims the benefit of priority of U.S. Provisional Application No. 61/809,155, filed on Apr. 5, 2013

U.S. patent application Ser. No. 15/230,214, filed on Aug. 5, 2016, which is a continuation of U.S. application Ser. No. 14/181,574, filed on Feb. 14, 2014, which claims the benefit of priority of U.S. Provisional Application No. 61/809,155, filed on Apr. 5, 2013

U.S. application Ser. No. 14/808,436, filed on Jul. 24, 2015, which claims the benefit of priority of U.S. Provisional Application No. 62/028,582, filed on Jul. 24, 2014

U.S. application Ser. No. 14/855,135, filed on Sep. 15, 2015 which claims the benefit of priority of U.S. Provisional Application No. 62/050,748, filed on Sep. 15, 2014

U.S. application Ser. No. 15/217,772, filed on Jul. 22, 2016, which claims the benefit of U.S. Provisional Application No. 62/195,693, filed on Jul. 22, 2015

Each of these referenced patent applications is incorporated herein in its entirety.

What is claimed is:

1. A device for generating electrical energy from mechanical motion, the device comprising:
  a surface float; and
  at least one force modifier disposed at least partially within an interior of the surface float, the force modifier to receive an input force at a pumping cylinder and apply a modified force to a generator through a driving cylinder, wherein:
    the pumping cylinder comprises a pumping tandem cylinder comprising first and second pistons connected to a first rod in a configuration to move together in the same compression stage at the same time, wherein the pumping tandem cylinder comprises a first pumping chamber and a second pumping chamber;
    the driving cylinder comprises a driving tandem cylinder comprising third and fourth pistons connected to a second rod in a configuration to move together in the same compression stage at the same time, wherein the driving tandem cylinder comprises a first driving chamber and a second driving chamber;
    the first pumping chamber is fluidly connected to both the first driving chamber and the second driving chamber; and
    the second pumping chamber is fluidly connected to both the first driving chamber and the second driving chamber.

2. The device of claim 1, wherein the generator is a linear generator.

3. The device of claim 1, wherein the modified force applied to the generator is greater in magnitude than the input force.

4. The device of claim 1, wherein the modified force applied to the generator is smaller in magnitude than the input force.

5. The device of claim 1, wherein the device further comprises a plurality of valves disposed between the pumping tandem cylinder and the driving tandem cylinder.

6. A method for generating electrical energy from mechanical motion, the method comprising:
  receiving an input force from a mechanical motion;
  modifying the input force, wherein modifying the input force further comprises receiving the input force at a pumping cylinder and converting the input force to an output force at a driving cylinder, wherein:
    the pumping cylinder comprises a pumping tandem cylinder comprising first and second pistons connected to a first rod in a configuration to move together in the same compression stage at the same time, wherein the pumping tandem cylinder comprises a first pumping chamber and a second pumping chamber;
    the driving cylinder comprises a driving tandem cylinder comprising third and fourth pistons connected to a second rod in a configuration to move together in the same compression stage at the same time, wherein the driving tandem cylinder comprises a first driving chamber and a second driving chamber; and
    the first pumping chamber is fluidly connected to both the first driving chamber and the second driving chamber; and
    the second pumping chamber is fluidly connected to both the first driving chamber and the second driving chamber; and
  applying the output force to a generator disposed within an interior of a surface float.

7. The method of claim 6, wherein the generator is a linear generator.

8. The method of claim 7, wherein the output force applied to the generator is smaller in magnitude than the input force.

9. The method of claim 6, further comprising fluidly disconnecting the first pumping chamber from the first and second driving chambers and fluidly connecting the second pumping chamber to the first and second driving chambers, wherein the second pumping chamber comprises a smaller diameter than the first pumping chamber.

10. The method of claim 6, wherein the output force applied to the generator is greater in magnitude than the input force.

11. A buoy apparatus for generating electrical energy from motion of ocean waves, the apparatus comprising:
  a surface float;
  a generator disposed within an interior of the surface float;
  a tether coupling point;
  a force modifier disposed at least partially within the interior of the surface float and coupled to the tether coupling point, the force modifier to receive at a pumping cylinder an input force from the tether coupling point, convert the input force to a modified output force at a driving cylinder, and apply the modified output force to the generator, wherein the force modifier comprises a hydraulic system, and wherein:
    the pumping cylinder comprises a pumping tandem cylinder comprising first and second pistons connected to a first rod in a configuration to move together in the same compression stage at the same time, wherein the pumping tandem cylinder comprises a first pumping chamber and a second pumping chamber;
    the driving cylinder comprises a driving tandem cylinder comprising third and fourth pistons connected to a second rod in a configuration to move together in the same compression stage at the same time, wherein the driving tandem cylinder comprises a first driving chamber and a second driving chamber; and the first pumping chamber is fluidly connected to both the first driving chamber and the second driving chamber; and the second pumping chamber is fluidly connected to both the first driving chamber and the second driving chamber.

12. The apparatus of claim 11, wherein the modified output force applied to the generator is smaller in magnitude than the input force.

13. The apparatus of claim 11, wherein the device further comprises a plurality of valves disposed between the pumping tandem cylinder and the driving tandem cylinder.

* * * * *